(12) United States Patent
Lidow et al.

(10) Patent No.: US 8,969,918 B2
(45) Date of Patent: Mar. 3, 2015

(54) ENHANCEMENT MODE GALLIUM NITRIDE TRANSISTOR WITH IMPROVED GATE CHARACTERISTICS

(75) Inventors: Alexander Lidow, Marina Del Ray, CA (US); Robert Beach, La Crescenta, CA (US); Alana Nakata, Redondo Beach, CA (US); Jianjun Cao, Torrance, CA (US); Guang Yuan Zhao, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 161 days.

(21) Appl. No.: 12/756,940

(22) Filed: Apr. 8, 2010

(65) Prior Publication Data

US 2010/0258842 A1    Oct. 14, 2010

Related U.S. Application Data

(60) Provisional application No. 61/167,788, filed on Apr. 8, 2009.

(51) Int. Cl.
| H01L 29/66 | (2006.01) |
| H01L 29/778 | (2006.01) |
| H01L 29/10 | (2006.01) |
| H01L 29/20 | (2006.01) |

(52) U.S. Cl.
CPC ......... H01L 29/7787 (2013.01); *H01L 29/1066* (2013.01); *H01L 29/2003* (2013.01)

USPC .................... 257/194; 257/E29.246; 438/172

(58) Field of Classification Search
None
See application file for complete search history.

(56) References Cited

U.S. PATENT DOCUMENTS

| 6,897,495 | B2 | 5/2005 | Yoshida et al. | |
|---|---|---|---|---|
| 6,914,273 | B2 | 7/2005 | Ren et al. | |
| 2006/0220060 | A1 | 10/2006 | Nakata et al. | |
| 2006/0273347 | A1 | 12/2006 | Hikita et al. | |
| 2007/0164314 | A1* | 7/2007 | Beach et al. | 257/194 |
| 2007/0272945 | A1* | 11/2007 | Matsuo et al. | 257/194 |
| 2008/0079023 | A1* | 4/2008 | Hikita et al. | 257/192 |
| 2008/0296618 | A1* | 12/2008 | Suh et al. | 257/190 |
| 2009/0072272 | A1* | 3/2009 | Suh et al. | 257/194 |

FOREIGN PATENT DOCUMENTS

JP     2007-311733 A     11/2007

OTHER PUBLICATIONS

X. Hu, et al. "Enhancement Mode AlGaN/GaN HFET With Selectively Grown pn Junction Gate", *Electronics Letters*, vol. 35, No. 8, pp. 753-754, Apr. 13, 2000.

(Continued)

*Primary Examiner* — Evan Pert
*Assistant Examiner* — Shaka White
(74) *Attorney, Agent, or Firm* — Dickstein Shapiro LLP (57) ABSTRACT

An enhancement mode GaN transistor having a gate pGaN structure having a thickness which avoids dielectric failure. In one embodiment, this thickness is in the range of 400 Å to 900 Å. In a preferred embodiment, the thickness is 600 Å.

1 Claim, 7 Drawing Sheets

(56) References Cited

OTHER PUBLICATIONS

T. Fuji et al. "High On/Off Ratio in Enhancement-Mode $Al_xGa_{1-N}$/GaN Junction Heterostructure Field Effect Transistors with P-Type GaN Gate Contact", *Japanese Journal of Applied Physics*, vol. 45, No. 39, pp. L1048-L1050, 2006.

Y. Uemoto et at. Gate Injection Transistor (GIT)—A Normally-Off AlGaN/GaN Power Transistor Using Conductivity Modulation, *IEEE Transactions on Electron Devices*, vol. 54, No. 12, pp. 3393-3399, Dec. 2007.

\* cited by examiner

FIG. 7

ENHANCEMENT MODE GALLIUM NITRIDE TRANSISTOR WITH IMPROVED GATE CHARACTERISTICS

CROSS REFERENCE TO RELATED APPLICATIONS

This application claims the benefit of U.S. Provisional Application Ser. No. 61/167,788, filed Apr. 8, 2009, which is incorporated by reference in its entirety.

BACKGROUND OF THE INVENTION

An enhancement mode gallium nitride (GaN) transistor is a recent development. In a GaN transistor, a P-type GaN (pGaN) gate is grown on top of aluminum gallium nitride (AlGaN)/GaN structure to create a positive threshold voltage. Known pGaN gate structures, however, do not have optimized thicknesses, which can lead to dielectric failure if the pGaN structure is too thick, or can lead to an over-conductance of current if the pGaN gate structure is too thin.

Figure 1:
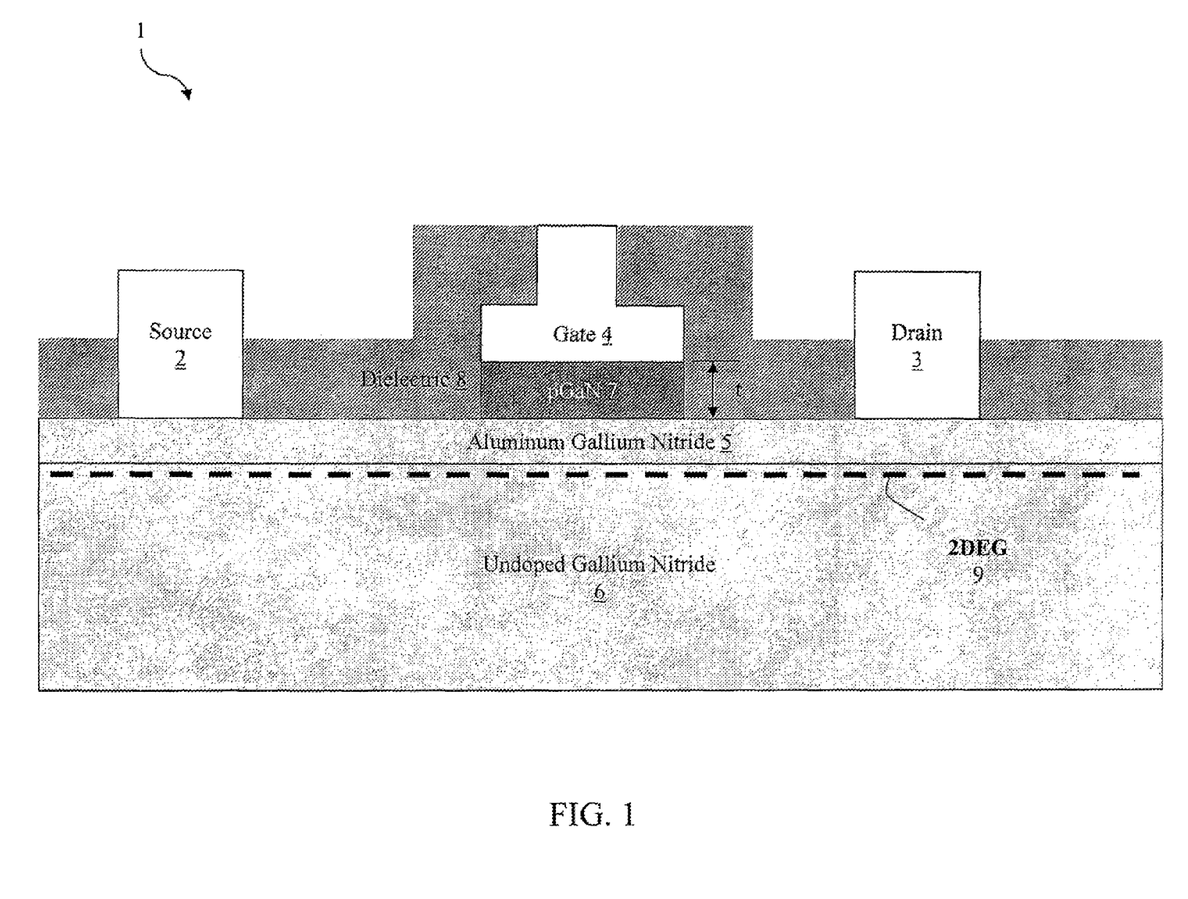
FIG. 1 is a cross section of an enhancement mode GaN transistor.

FIG. 1 shows a cross-section of a known GaN transistor 1. GaN transistor 1 has an AlGaN layer 5 disposed on top of an undoped GaN layer 6, with a 2 DEG heterojunction 9 between those layers. On top of the AlGaN layer 5 is a source 2, a drain 3, and a gate 4. The gate 4 has a pGaN structure 7 between the gate metal 4 and the AlGaN layer 5. A dielectric 8 covers the exposed AlGaN layer and the sidewalls of gate 4 and pGaN structure 7. The pGaN structure 7 has a thickness t. The gate dielectric 7 is determined by the sidewall between the gate 4 and the AlGaN layer 5. The 2 DEG heterojunction 9 is modulated by the gate 4.

Figure 2:
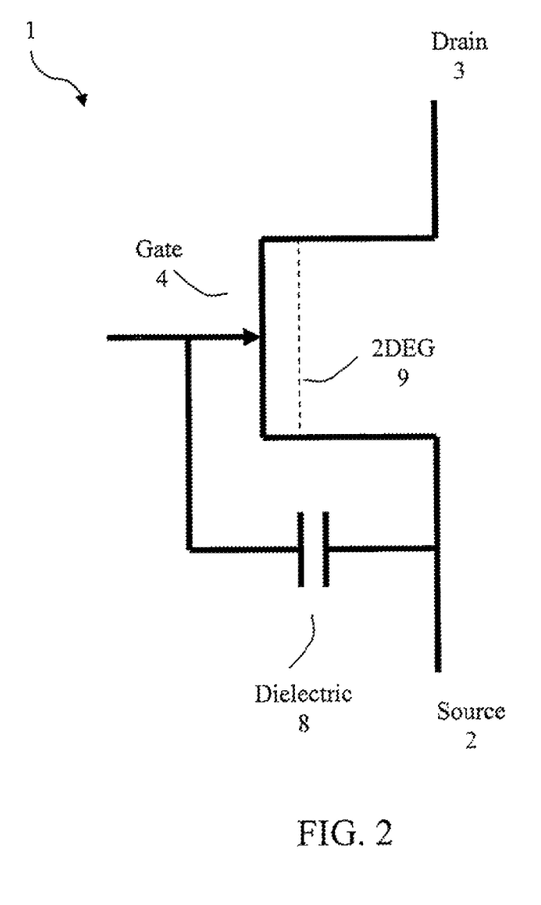
FIG. 2 is a circuit diagram of an enhancement mode GaN transistor.

FIG. 2 shows a circuit diagram of the known GaN transistor 1 from FIG. 1. FIG. 2 shows that the dielectric 8 is in parallel with the gate diode. It is to be understood that reference numbers used herein refer to FIGS. 1 and 2.

Figure 3:
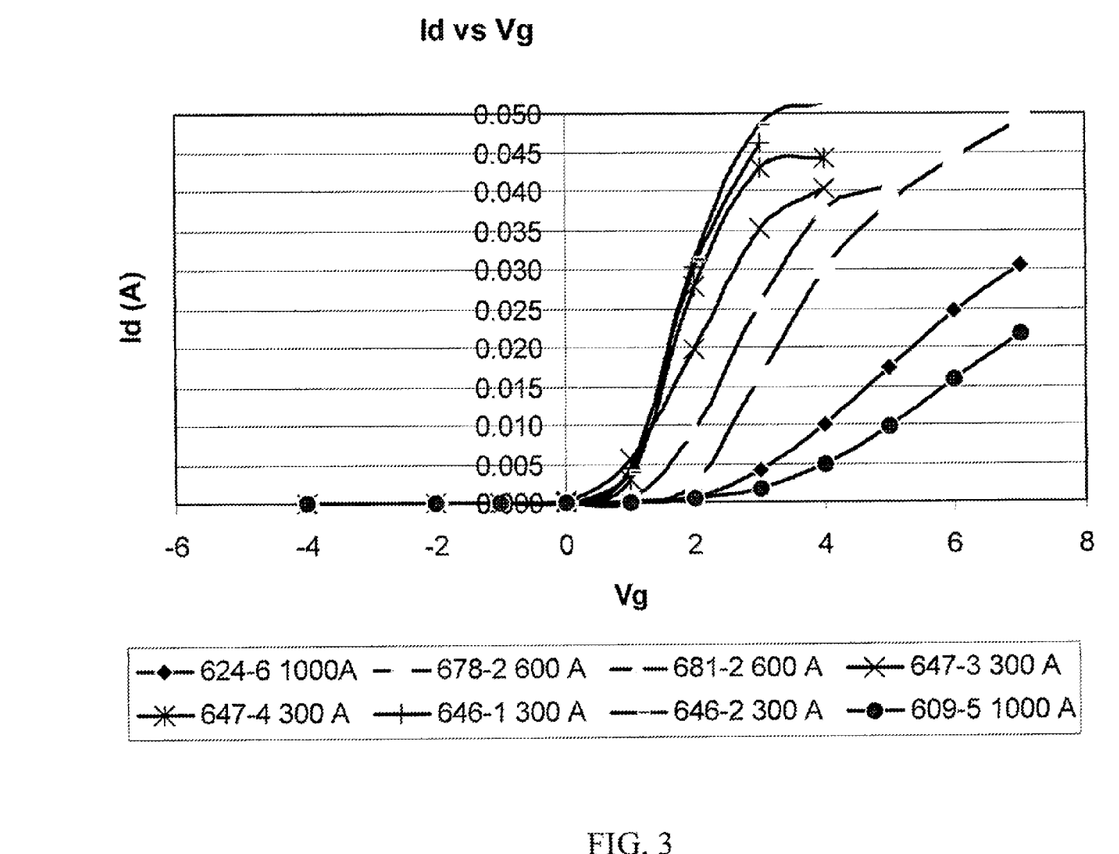
FIG. 3 is a graph showing how transconductance varies for gates of varying thicknesses.

FIG. 3 shows how transconductance (input voltage vs output current) varies for gates with pGaN structures having different thicknesses t. As the pGaN thickness t increases, transconductance decreases and gate diode forward drop increases. In particular, FIG. 3 shows that a gate with a pGaN structure having a thickness t of 300 Å has a higher transconductance than a gate with a pGaN structure having a thickness t of 600 Å, which has a higher transconductance than a gate having a pGaN structure with a thickness t of 1000 Å. A higher gate voltage is required to fully enhance the devices that have a thicker pGaN structure. If the gate dielectric fails before the device is fully enhanced, maximum performance of the device cannot be achieved.

Known enhancement mode GaN transistors all have gates with pGaN structures of thicknesses t of at least 1000 Å. For example, X. Hu, et al., "Enhancement mode AlGaN/GaN HFET with selectively grown pn junction gate," 36 *Electronic Letters*, Issue 8, at pp. 753-54 (Apr. 13, 2000) teaches a 1000 Å pGaN structure. In addition, U.S. Patent Application Publication No. 2006/0273347 teaches pGaN structures with thicknesses of 1000 Å. However, explained below, pGaN thicknesses t greater than or equal to 1000 Å can lead to dielectric failure.

Figure 5:
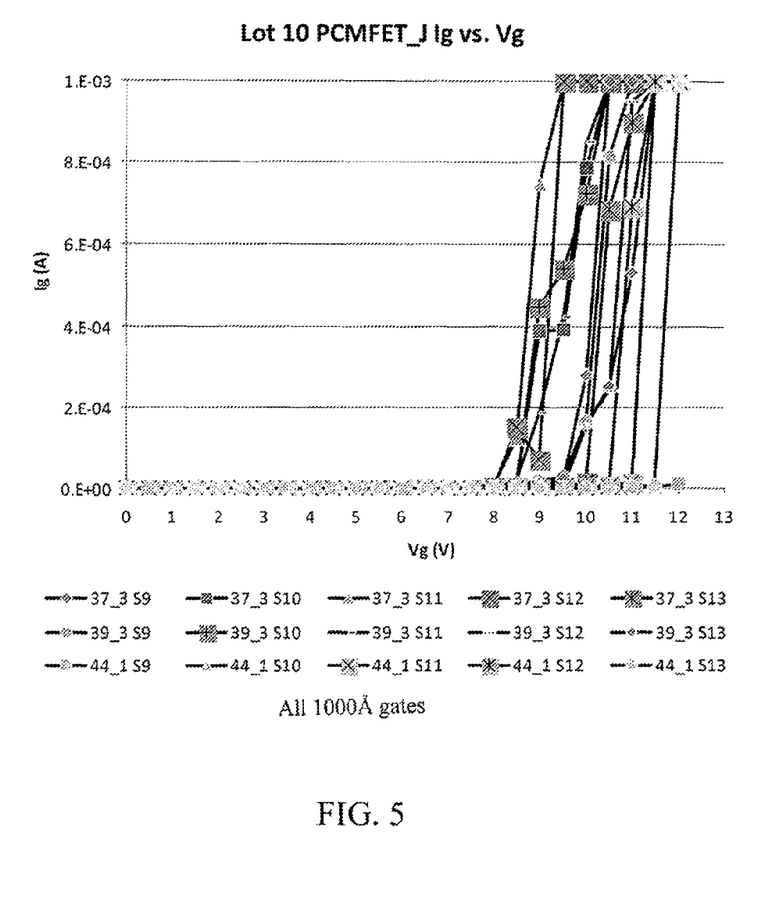
FIG. 5 shows the gate P-N junction I-V characteristics of a gate having a pGaN structure with a thickness t of 1000 Å.

FIG. 5 shows the gate I-V characteristics for a pGaN structure with a thickness t of 1000 Å. The data in FIG. 5 shows that the gate having a pGaN structure with a thickness t of 1000 Å failed when 8V-12V was applied to the gate. Thus, a thickness t of 1000 Å is too thick for a pGaN structure because the gate behaves like a dielectric. Dielectric failure is catastrophic and can occur before the 2 DEG heterojunction is fully enhanced or can occur as a result of gate overshoot (shown below) during fast switching.

Figure 6:
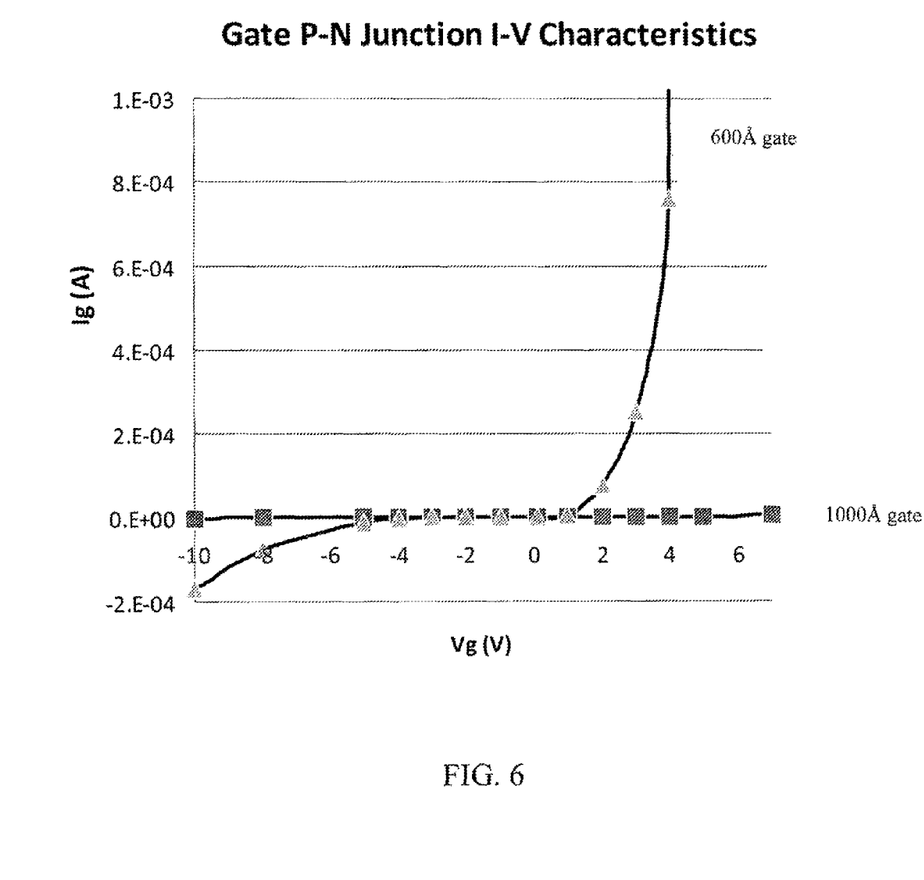
FIG. 6 is a graph showing the gate P-N junction I-V characteristics for a pGaN structure with a thickness t of 1000 Å compared with a structure with a thickness t of 600 A, showing that the device with a 1000 A gate has not turned on (thus allowing current to flow) at 6 volts, which increases the risk of dielectric failure.

FIG. 6 shows the gate I-V characteristics for a pGaN structure having a thickness t of 1000 Å. As can be seen in the graph in FIG. 3, a gate having a pGaN structure with a thickness t of 1000 Å has not fully turned on at 6 volts, which increases the risk of dielectric failure.

Figure 7:
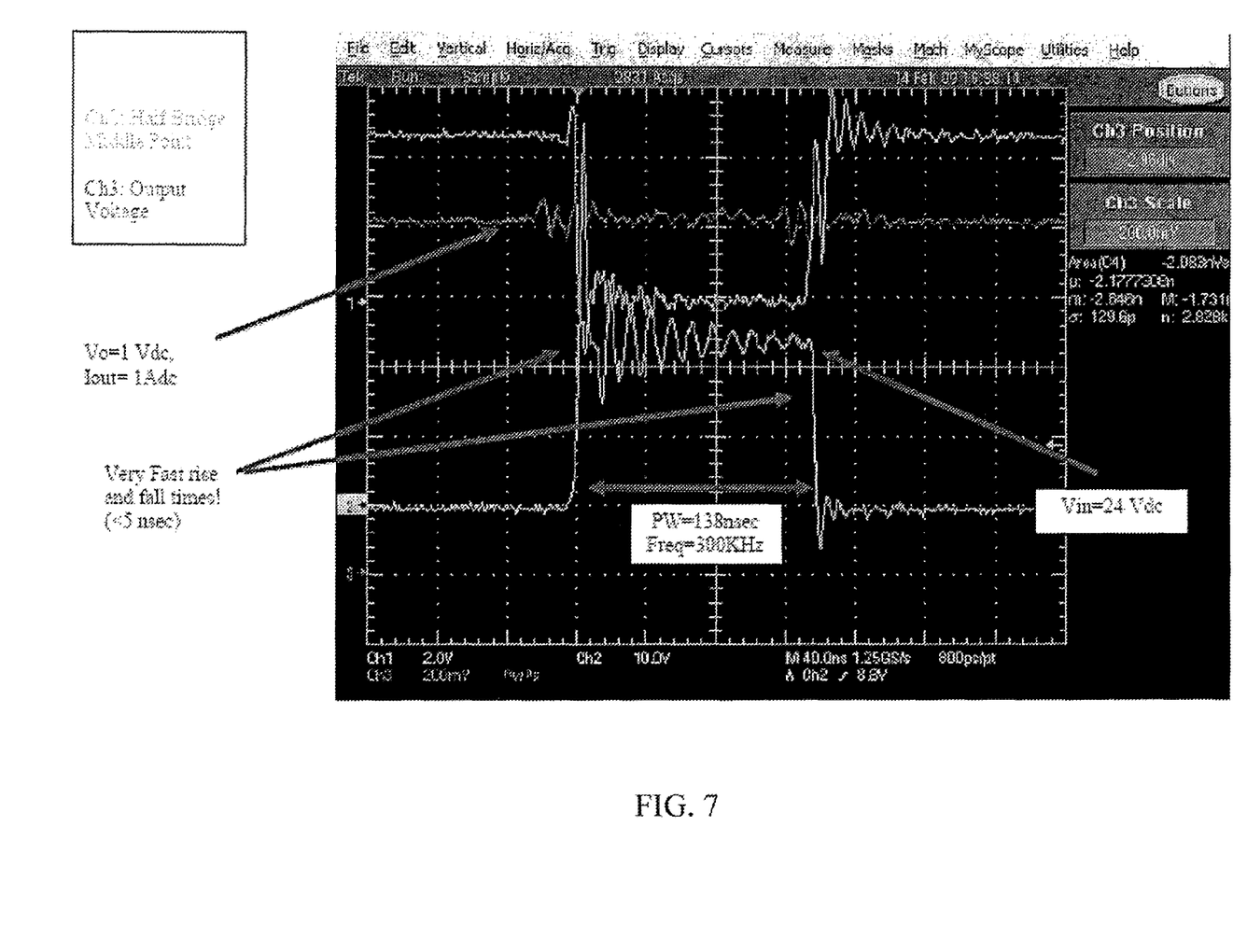
FIG. 7 is a graph showing the overshoot associated with prior art gates.

FIG. 7 shows the overshoot associated with a gate. As can be seen from the graph, the fluctuations in voltage can be extreme at the high switching speed shown. If the threshold voltage of the gate is close to the withstand voltage of the dielectric, the dielectric will likely rupture as a result of gate overshoot that may exceed the withstand voltage level. Gates having pGaN structures with thicknesses t much less than the withstand voltage are less likely to be adversely affected by gate overshoot because the voltage applied to activate the gate will not be as close to the withstand voltage, meaning that the gate overshoot is not likely to meet or exceed to the withstand voltage.

It is apparent from the foregoing that 1000 Å is too thick for a pGaN gate structure in an enhancement mode GaN transistor. It would desirable, therefore, to provide an enhancement mode GaN transistor with a pGaN gate that is sufficiently thin to avoid the risk of dielectric failure.

SUMMARY OF THE INVENTION

The present invention is directed to an enhancement mode GaN transistor having a pGaN gate structure thin enough to avoid dielectric failure. In one embodiment, for 5V gate voltage applications, this thickness is in the range of 400 Å to 900 Å. In a preferred embodiment, the thickness is 600 Å. Such thicknesses are thick enough to avoid over-conductance of current.

DETAILED DESCRIPTION OF THE INVENTION

The present invention is directed to an enhancement mode GaN transistor having a pGaN gate thickness in the range of 400 Å to 900 Å. Such a range is thin enough to avoid dielectric failure. As described below, such a range is also thick enough to avoid the problems associated with pGaN gates that are too thin. In a preferred embodiment, the pGaN gate thickness is 600 Å.

The pGaN gate structure is Mg doped and activated to p-type conductivity. In one embodiment, the pGaN gate structure is a semi-insulating GaN that is doped with Mg and compensated with hydrogen.

Figure 4:
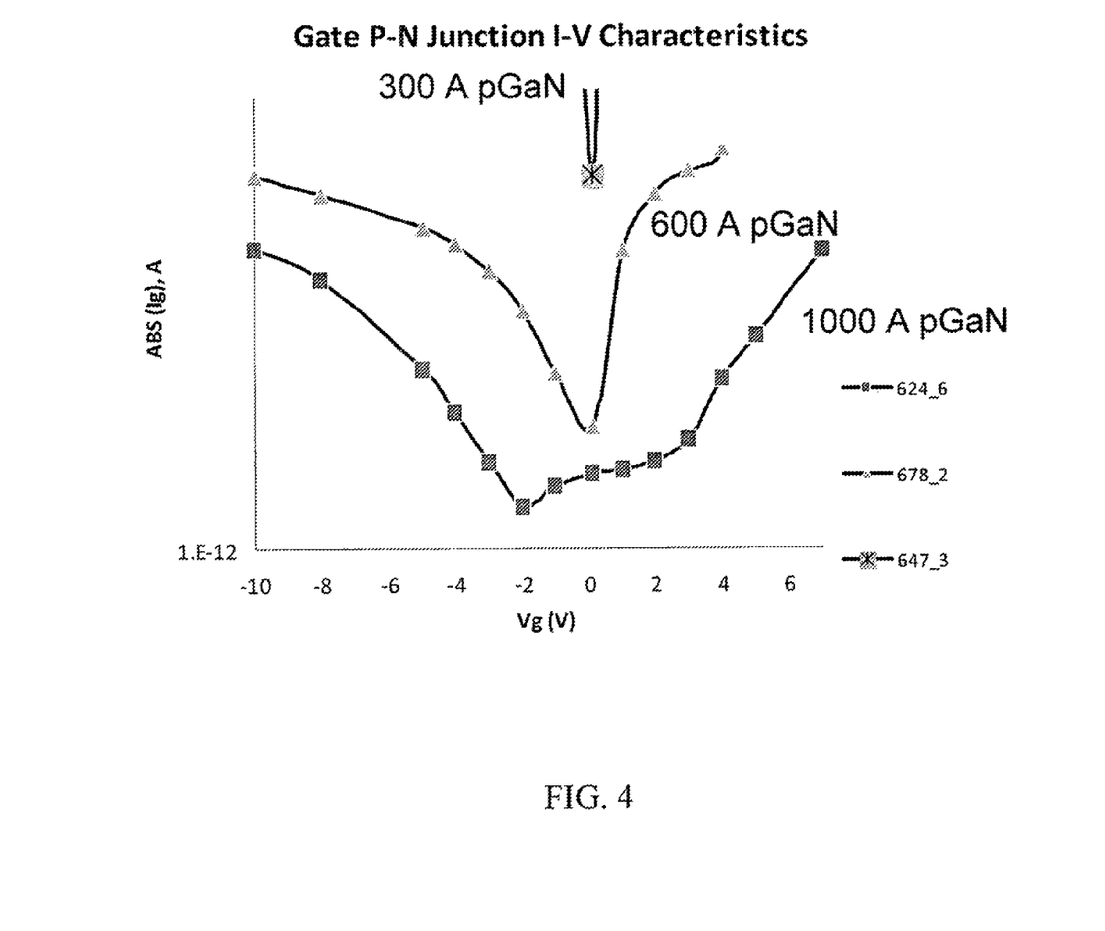
FIG. 4 is a graph showing the gate P-N junction I-V characteristics for devices with gates of varying thicknesses.

As shown in FIG. 4, a gate having a pGaN structure with a thickness of 600 Å is sufficiently thick to conduct a measurable amount of current. FIG. 4 also shows that a gate having a pGaN structure with a thickness t of 300 Å conducts an immeasurable amount of current with any amount of positive or negative voltage applied. Thus, a thickness of 300 Å is too thin for a pGaN structure.

As shown in FIG. 6, a gate with pGaN structure having a thickness of 600 Å turned on before dielectric failure occurred, thus avoiding dielectric failure. Dielectric failure is also less likely with a gate having a pGaN structure with a thickness of 600 Å because the gate turns on at a voltage much lower than the withstand voltage of the dielectric, meaning that gate overshoot is less likely to push the gate voltage near the withstand voltage.

The above gate thicknesses and measurements relate to a device operated at a rated gate voltage of 5V. Obviously, at lower rated gate voltages, the thickness of the pGaN structure would be correspondingly reduced. Thus, the enhancement mode GaN transistor has a gate structure with a thickness of a factor A×(400 Å to 900 Å), wherein the factor A corresponds to the ratio of rated gate voltage/5V. The term "rated gate voltage" in the above-described embodiments means the maximum safe operating gate voltage of the device.

The above description and drawings are only to be considered illustrative of a specific embodiment of the invention which achieves the features and advantages described herein. Modifications and substitutions to specific process conditions can be made. Accordingly, the invention is not considered as being limited by the foregoing description and drawings.

We claim:

1. An enhancement mode gallium nitride (GaN) transistor having a rated gate voltage of 5 volts, comprising:
a p-type GaN gate structure with a thickness of 600 Å.

* * * * *